(12) United States Patent
Cyr (10) Patent No.: US 9,774,244 B2
(45) Date of Patent: Sep. 26, 2017

(54) POWER CONVERTER CONFIGURED FOR LIMITING SWITCHING OVERVOLTAGE

(71) Applicant: TM4 INC., Boucherville (CA)

(72) Inventor: Jean-Marc Cyr, Candiac (CA)

(73) Assignee: TM4 INC., Boucherville (CA)

( * ) Notice: Subject to any disclaimer, the term of this patent is extended or adjusted under 35 U.S.C. 154(b) by 0 days.

(21) Appl. No.: 15/033,260

(22) PCT Filed: Oct. 28, 2014

(86) PCT No.: PCT/CA2014/051039
§ 371 (c)(1),
(2) Date: Apr. 29, 2016

(87) PCT Pub. No.: WO2015/061901
PCT Pub. Date: May 7, 2015

(65) Prior Publication Data
US 2016/0285357 A1   Sep. 29, 2016

Related U.S. Application Data

(60) Provisional application No. 61/898,502, filed on Nov. 1, 2013.

(51) Int. Cl.
*H02M 1/32* (2007.01)
*H02M 7/537* (2006.01)
(Continued)

(52) U.S. Cl.
CPC ............ *H02M 1/32* (2013.01); *H02M 7/537* (2013.01); *H02M 7/538* (2013.01);
(Continued)

(58) Field of Classification Search
CPC .......... H02M 1/00; H02M 3/155; H02M 1/32; H02M 2001/0054; H02M 7/537;
(Continued)

(56) References Cited

U.S. PATENT DOCUMENTS 6,184,740 B1 * 2/2001 Miettinen ............ H03K 17/168
327/109
8,213,146 B2    7/2012 Katoh et al.
(Continued)

FOREIGN PATENT DOCUMENTS

| WO | 2013/082705 | 6/2013 |
| WO | 2014/043795 | 3/2014 |
| WO | 2014/161080 | 10/2014 |

OTHER PUBLICATIONS

Cyr et al., "Reducing switching losses and increasing IGBT drive efficiency with ReflexTM gate driver technology," TM4 Inc., Decielec, Tarbes, France, published on Apr. 23, 2013.
(Continued)

*Primary Examiner* — Gustavo Rosario Benitez
(74) *Attorney, Agent, or Firm* — K&L Gates LLP (57) ABSTRACT

The present disclosure relates to a power converter configured for limiting switching overvoltage. The power converter comprises a pair of commutation cells. Each commutation cell includes a power electronic switch and a gate driver connected to a gate of the power electronic switch. A reference of the gate driver of a first commutation cell is connected to a ground of the power converter while a reference of the gate driver of a second commutation cell is connected to a collector of the power electronic switch of the first commutation cell. The gate driver of the second commutation cell has no negative voltage power input, either through using a single voltage power supply or by connecting a negative voltage connection of the dual voltage power supply to ground.

8 Claims, 9 Drawing Sheets

(51) Int. Cl.
*H02M 7/538* (2007.01)
*H03K 17/0812* (2006.01)
*H03K 17/082* (2006.01)
*H02M 1/00* (2006.01)

(52) U.S. Cl.
CPC ... *H03K 17/0828* (2013.01); *H03K 17/08128* (2013.01); *H02M 2001/0054* (2013.01); *H03K 2217/0063* (2013.01); *H03K 2217/0072* (2013.01); *Y02B 70/1491* (2013.01)

(58) Field of Classification Search
CPC ........ H02M 7/538; H02M 1/08; H02M 1/081; H02M 1/082; H03K 17/08; H03K 17/081; H03K 17/0812; H03K 17/0814; H03K 17/08128; H03K 17/0828; H03K 2217/0063; H03K 2217/0072; Y02B 70/1491
See application file for complete search history.

(56) References Cited

U.S. PATENT DOCUMENTS

| | | | | |
|---|---|---|---|---|
| 2004/0124818 A1* | 7/2004 | Dequina | ............... | H02M 1/36 323/282 |
| 2004/0130307 A1* | 7/2004 | Dequina | ............... | H02M 1/38 323/282 |
| 2004/0169975 A1* | 9/2004 | Muenzer | ............... | H02H 9/047 361/91.1 |
| 2005/0063124 A1* | 3/2005 | Lundberg | ........... | H03K 17/0828 361/111 |
| 2007/0170897 A1* | 7/2007 | Williams | ............... | H02M 3/155 323/222 |
| 2007/0187217 A1* | 8/2007 | Tai | ......................... | H02M 1/08 200/237 |
| 2007/0195563 A1* | 8/2007 | Shiraishi | ................ | H01L 24/49 363/25 |
| 2008/0084642 A1 | 4/2008 | Kato et al. | | |
| 2010/0321847 A1 | 12/2010 | Katoh et al. | | |
| 2012/0235663 A1* | 9/2012 | Bayerer | ............... | H02M 1/088 323/311 |
| 2013/0181750 A1* | 7/2013 | Lobsiger | ......... | H03K 17/08148 327/109 |

OTHER PUBLICATIONS

Gerster, "Fast High-power /High-voltage Switch Using Series-connected IGBTs with Active Gate-controlled Voltage-balancing", Applied Power Electronics Conference and Exposition, APEC'94 Conference Proceedings, Ninth Annual IEEE, 1994.

Van Nguyen et al., "Series Connection of IGBTs With Self-Powering Technique and 3-D Topology," IEEE Transactions on Industry Applications, vol. 47, No. 4, Jul./Aug. 2011, pp. 1844-1852.

PCT International Search Report for International Patent Application No. PCT/CA2014/051039, dated Jan. 20, 2015, 3 pages.

PCT Written Opinion of International Searching Authority for International Patent Application No. PCT/CA2014/051039 dated Jan. 20, 2015, 4 pages.

Cyr et al., "Limiting the overshoot on IGBT during turn-off using stray inductance," International Conference and Exhibition Automotive Power Electronics, vol. 812, Apr. 7, 2011, pp. 16-20.

Supplementary European Search Report for EP Application No. 14 85 7827, dated Apr. 20, 2017, 2 pages.

* cited by examiner

POWER CONVERTER CONFIGURED FOR LIMITING SWITCHING OVERVOLTAGE

CROSS REFERENCE TO RELATED APPLICATIONS

This application is a national phase under 35 U.S.C. §371 of International Patent Application No. PCT/CA2014/051039 filed on Oct. 28, 2014, which claims priority to and the benefit of U.S. Provisional Patent Application No. 61/898,502 filed on Nov. 1, 2013, and the entirety of which application is incorporated by reference herein.

TECHNICAL FIELD

The present disclosure relates to the field of power electronics. More specifically, the present disclosure relates to power converter configured for limiting switching overvoltage.

BACKGROUND

Commutation cells are commonly used in electronic systems that require conversion of a voltage source, including both DC-DC converters and DC-AC converters, which are often called inverters. With the limited space allowed for power converter circuits, such as those used for example in electric and/or electric hybrid automotive applications, and given the high cost of the semi-conductors, the demand for integration of these commutation cells increases.

A known way of reducing the space occupied by semiconductors in power converter circuits is to increase their efficiency to allow the size of the cooling surface to be reduced.

Losses in power electronic switches present in conventional power converter circuits are mainly caused by two sources; conduction losses and switching losses. One way to reduce switching losses is generally by accelerating turn-on and turn-off of the power electronic switches. However, fast turn-off of the power electronic switches generates overvoltage in stray inductances of their high-frequency loop. It is thus often required to slow down turning off of the power electronic switches to protect them against overvoltage. This may seriously impact the overall efficiency of conventional power converter circuits.

Figure 1:
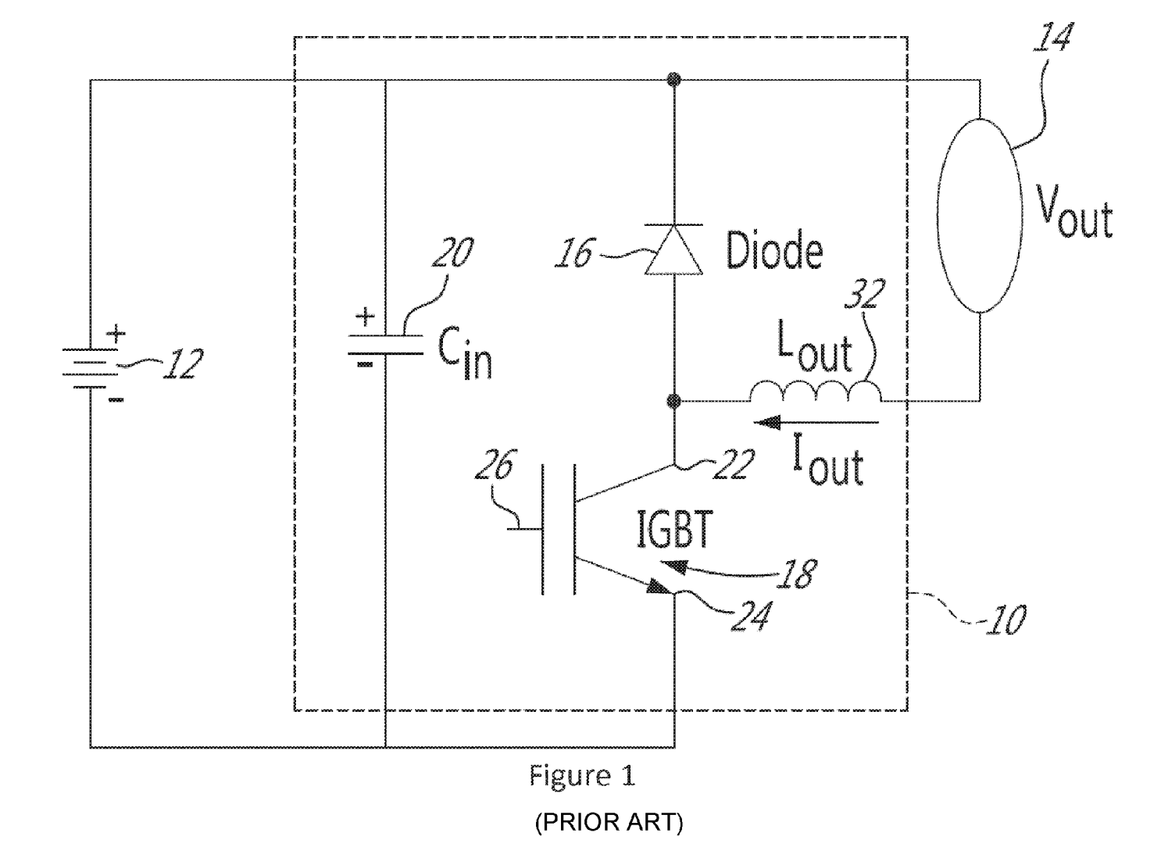
FIG. 1 is an idealized circuit diagram of a conventional commutation cell such as those used in conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14, which may be a resistive load, an electric motor, and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10, of the load 14, and of the voltage source 12, in which energy flows from the voltage source 12 to the load 14, i.e. from left to right on the drawing. The commutation cell 10 can also be used in a reverse configuration in which energy flows in the opposite direction.

When turned on, the power electronic switch 18 allows current to pass therethrough, from its collector 22 to its emitter 24; at that time, the power electronic switch 18 can be approximated as a closed circuit. When turned off, the power electronic switch 18 does not allow current to pass therethrough and becomes an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high", the power electronic switch 18 allows passing of current from the collector 22 to the emitter 24. When the voltage applied between the gate 26 and the emitter 24 is "low", the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ce}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types, for example bipolar transistors, the term "gate" may be replaced with "base", the base being controlled by a current as opposed to the gate that is controlled by a voltage. These distinctions do not change the overall operation principles of the commutation cell 10.

Figure 2:
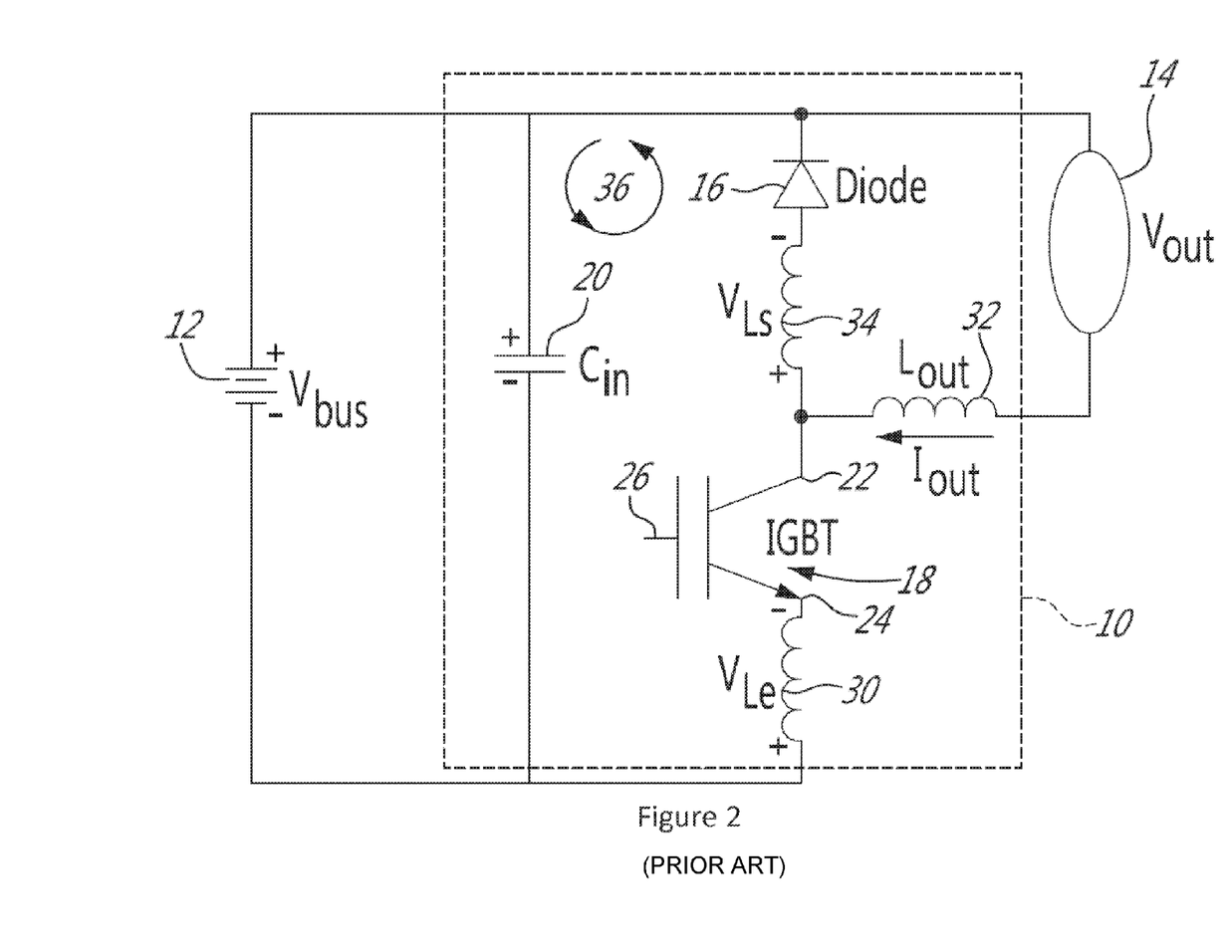
FIG. 2 is another circuit diagram of the conventional commutation cell of FIG. 1, showing parasitic (stray) inductances.

FIG. 2 is another circuit diagram of the conventional commutation cell of FIG. 1, showing parasitic (stray) inductances. In contrast with the idealized model of FIG. 1, connections between components of an actual commutation cell define parasitic inductances. Though the parasitic inductances are distributed at various places within the commutation cell 10, a suitable model presented in FIG. 2 shows two (2) distinct inductances representing the overall parasitic inductance, including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop because its current remains fairly constant through the commutation period.

Figure 3:
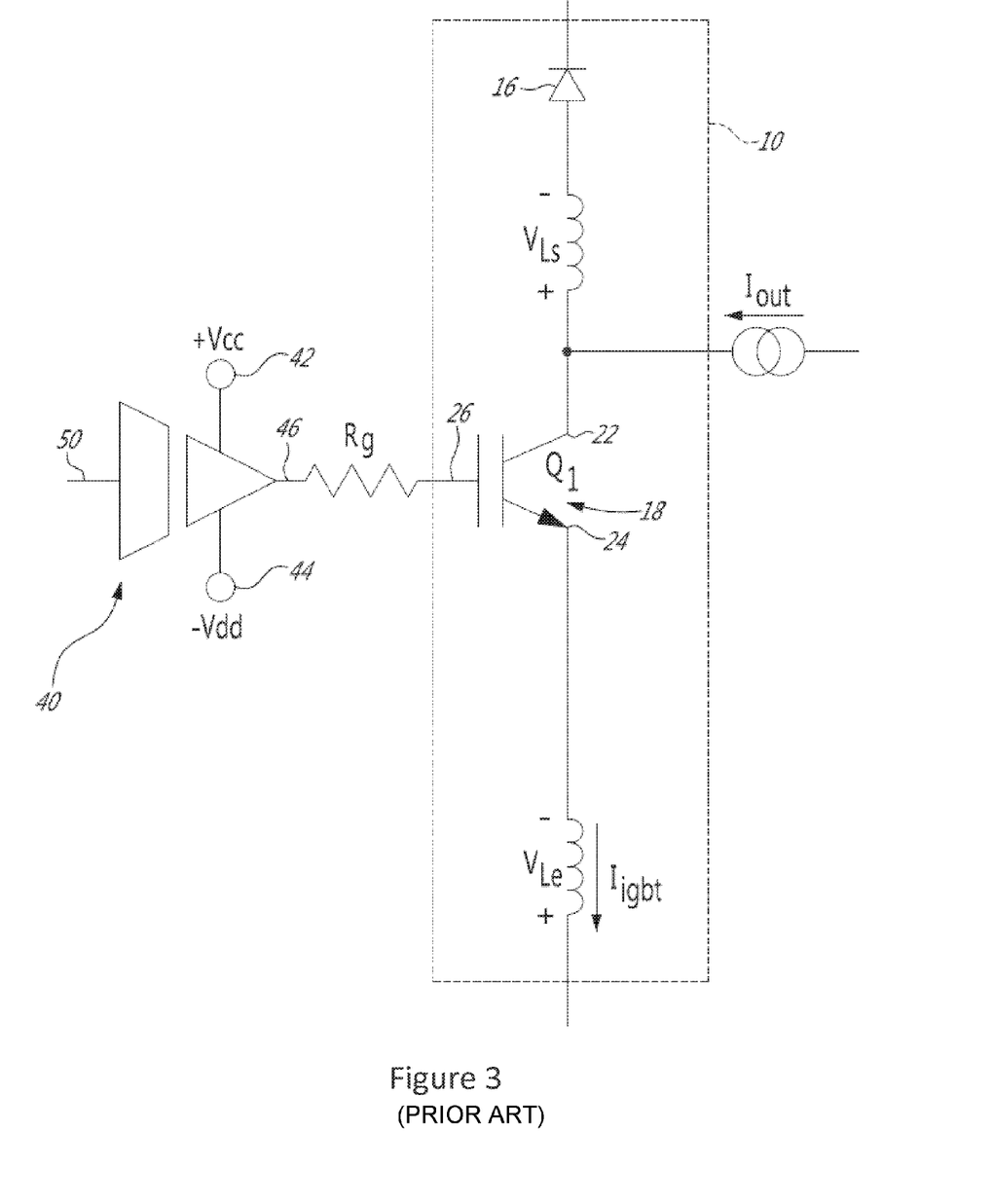
FIG. 3 is a circuit diagram of a conventional commutation cell further showing a gate driver.

FIG. 3 is a circuit diagram of a conventional commutation cell further showing a gate driver 40. Some elements of the commutation cell 10 are not shown on FIG. 3, in order to simply the illustration. FIG. 3 further shows a gate driver 40 having a positive supply voltage 42 and a negative supply voltage 44, an output 46 of the gate driver 40 being connected to the gate 26 of the power electronic switch 18 via a gate resistor $R_g$. The positive supply voltage 42 of the gate driver 40 has a value denoted $+V_{cc}$, for example +15 volts above a ground reference (shown on a later Figure) while the negative supply voltage 44 has value denoted $-V_{dd}$, for example -5 volts below the ground reference. An input 50 of the gate driver 40 is connected to a controller (not shown) of the commutation cell 10, as is well known in the art. A voltage at the output 46 of the gate driver 40 goes up to $+V_{cc}$, and goes down to $-V_{dd}$ in order to control the voltage at the gate 26. The input resistance of the gate 26 to emitter may be very high, especially in the case of an IGBT. However, a parasitic Miller capacitance $C_{ge}$ (shown on a later Figure), present between the gate 26 and the emitter 24, causes some current to flow from the output 46 when the gate driver 40 alternates between +14, and $-V_{dd}$. The value $R_g$ of the gate resistor is selected as a function of the parasitic capacitance $C_{ge}$ and of a desired switching rate of the power electronic switch 18 so that the voltage at the gate 26 changes at rate appropriate for the desired switching rate.

On FIG. 3, a current $I_{igbt}$ flowing through the power electronic switch 18 and through the emitter parasitic inductance 30 is essentially equal to $I_{out}$ when the power electronic switch 18 is closed, and quickly reduces to zero (substantially) when the power electronic switch 18 turns off.

When the power electronic switch 18 turns on or off, the current $I_{igbt}$ flowing therethrough increases or diminishes at a fast rate. These variations of $I_{igbt}$, denoted di/dt, generate voltage across inductances 30 and 34, according to the well-known equation (1):

$$V_L = L \cdot \frac{di}{dt} \quad (1)$$

wherein $V_L$ is a voltage induced across an inductance and L is an inductance value.

A voltage $V_{Ls}$ is generated across the parasitic inductance 34 and a voltage $V_{Le}$ is generated across the emitter parasitic inductance 30. On FIGS. 2 and 3, the polarities shown across the high frequency loop inductance 34, including the emitter inductance 30 reflect voltages obtained upon turn-off of the power electronic switch 18, when the $I_{igbt}$ current diminishes very rapidly, di/dt thus taking a negative value. Upon turn-on of the power electronic switch 18, voltages across the high frequency loop inductance 34, including the emitter inductance 30 are in the opposite direction.

These voltages $V_{Ls}$ and $V_{Le}$ are in series with $V_{bus}$ from the voltage source 12. When the power electronic switch 18 turns off, the collector 22 to emitter 24 voltage increases until the freewheel diode 16 turns on. At that time, addition of $V_{bus}$, $V_{Ls}$ and $V_{Le}$ results in an important overvoltage applied between the collector 22 and the emitter 24 of the power electronic switch 18. Though power electronic switches are rated for operation at some level of voltage, extreme overvoltage can reduce the lifetime of any power electronic switch to thereby lead to its premature failure or even break the device.

Figure 4:
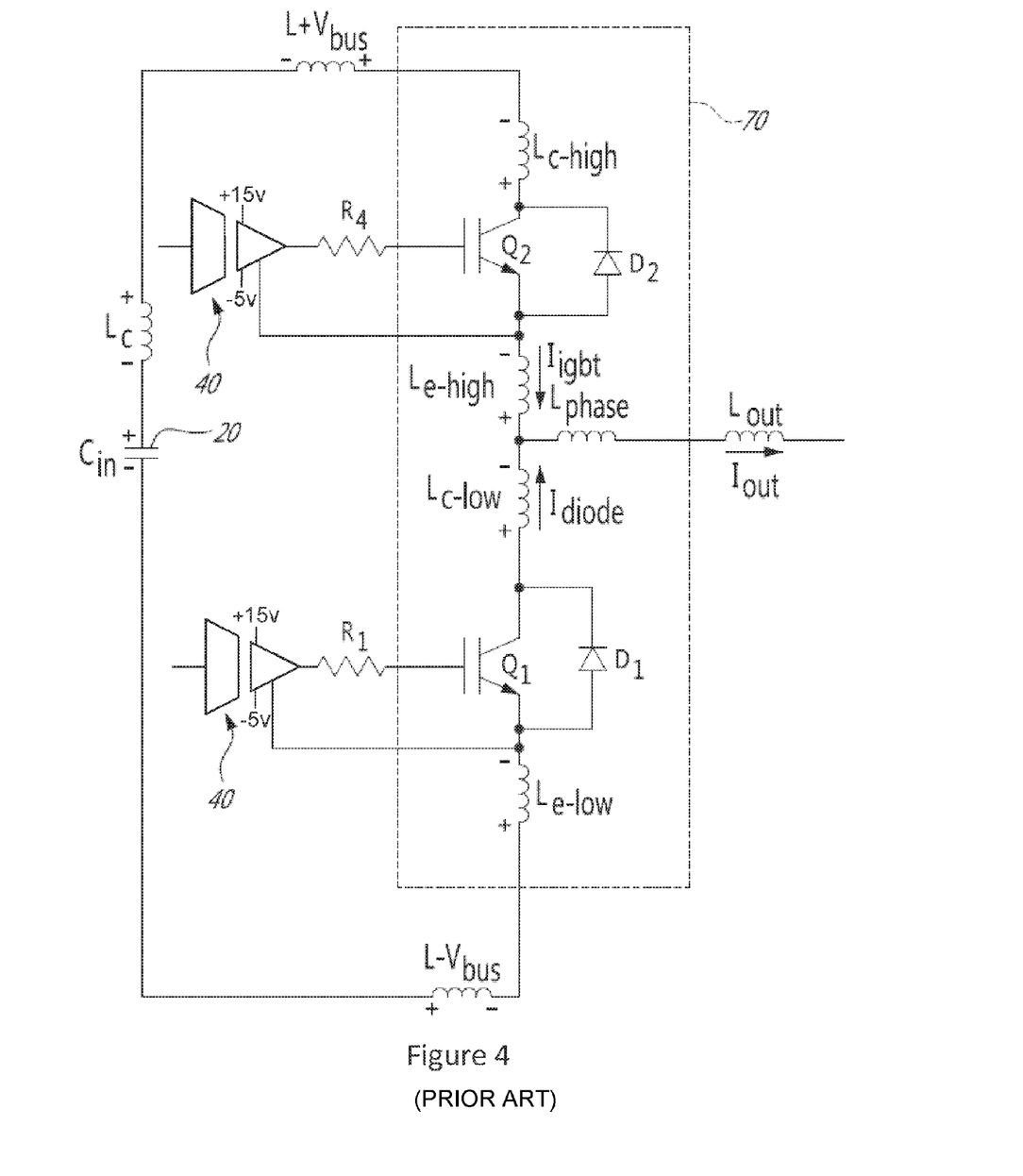
FIG. 4 is a circuit diagram of a conventional IGBT leg formed of two conventional commutation cells.

FIG. 4 is a circuit diagram of a conventional IGBT leg formed of two conventional commutation cells. Two commutation cells 10 introduced in the above description of FIGS. 1-3, in which IGBTs are used as power electronic switches 18 in the example of FIG. 4, are connected in a single loop to form an IGBT leg 70. As shown on FIG. 4, both gate drivers 40 have positive and negative supply voltages connected to +15V and -5V power sources (not shown). In the conventional IGBT leg 70, applying a negative voltage (e.g. -5V) to the gate driver 40 of one of the IGBTs slows down its turn-off while the opposite IGBT is being turned on.

A first power electronic switch (bottom IGBT $Q_1$) operates in tandem with a first freewheel diode (top freewheel diode $D_2$) and a second power electronic switch (top IGBT $Q_2$) operates in tandem with another freewheel diode (bottom freewheel diode $D_1$). Each IGBT has its own gate driver 40. A voltage source (not shown) provides a voltage $V_{bus}$ in parallel to an input capacitance 20 ($C_{in}$) connected to the IGBT leg 70 via a parasitic inductance $L_c$. Inductances inherently provided in wires, connections, decoupling capacitor and circuit board traces of a power converter have been represented in FIG. 4. A three-phase power converter used for powering a three-phase electric motor (not shown) from a battery (also not shown), would comprise three (3) IGBT legs 70 as shown on FIG. 4. Since such power converters are believed well-known, they are not described in further details herein.

As can be seen from FIG. 4, a reference of each gate driver is connected to the emitter of the IGBT $Q_1$ and $Q_2$, typically known as logical pins of the IGBTs $Q_1$ and $Q_2$. For concision purpose, a description of FIG. 4 focuses on its bottom portion including the bottom IGBT $Q_1$.

The overvoltage effect on a power electronic switch 18, discussed in the above description of FIGS. 2 and 3, also applies to the IGBTs $Q_1$ and $Q_2$.

When the bottom IGBT $Q_1$ is turned off, current transits from the bottom IGBT $Q_1$ to the top freewheel diode $D_2$, during an overvoltage period. A properly selected IGBT is able to support the overvoltage created by a current variation (di/dt) across various parasitic inductances ($L_c$, $L_{+Vbus}$, $L_{c-high}$, $L_{e-high}$, $L_{c-low}$, $L_{e-low}$ and $L_{-Vbus}$) present in the IGBT leg 70. Indeed, since the inductances resist change of current therein, additive voltages develop in the IGBT leg 70 as illustrated by the polarities of the parasitic inductances shown on in FIG. 4. These voltages, added to the voltage $V_{bus}$ of the source, often result in a voltage exceeding the maximal collector to emitter voltage $V_{ce}$ rating of the bottom IGBT $Q_1$. The top IGBT $Q_2$ is subject to the same problem.

Figure 5:
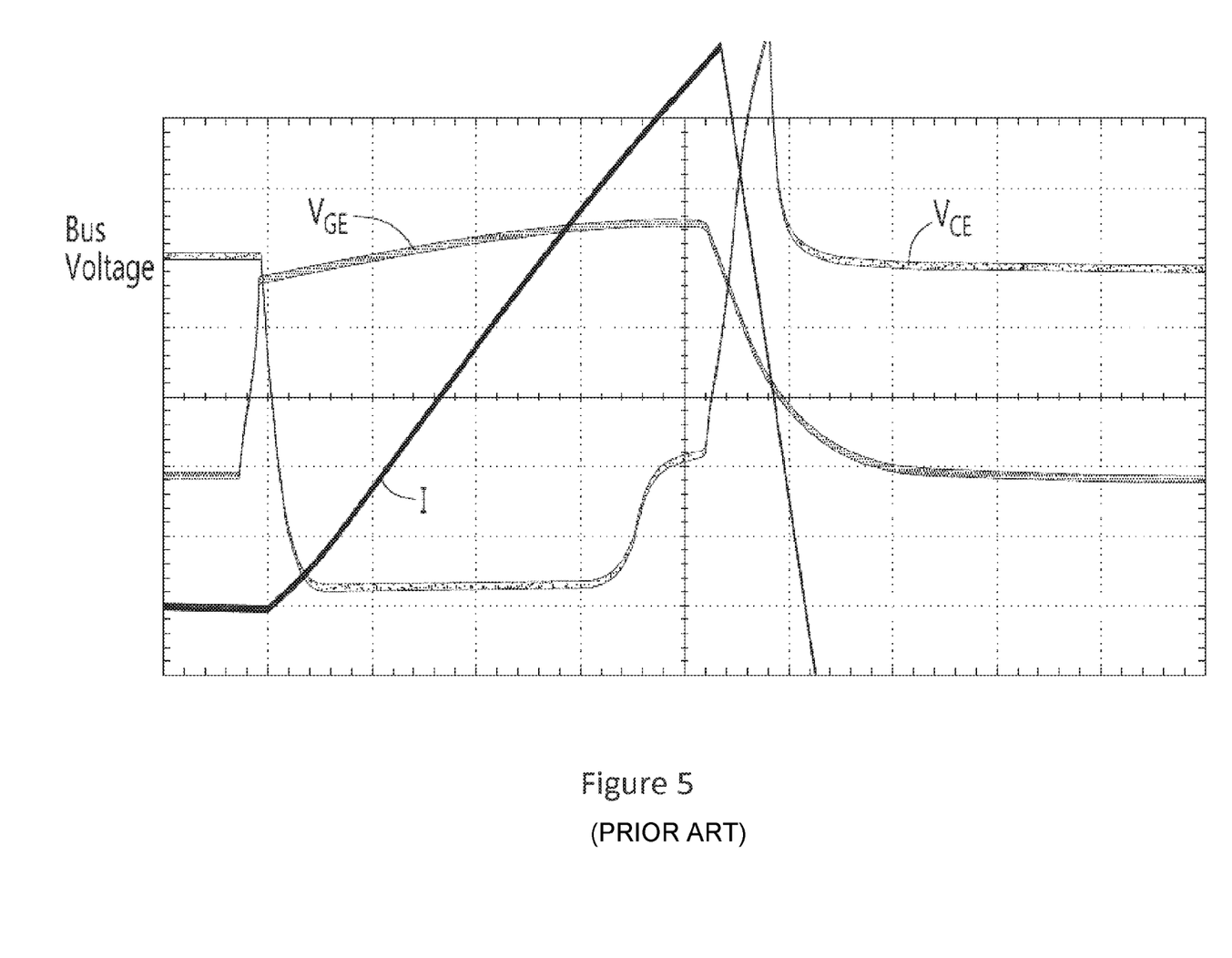
FIG. 5 is a diagram showing current and voltage waveforms at turn-off of the IGBTs of FIG. 4.

FIG. 5 is a diagram showing current and voltage waveforms at turn-off of the IGBTs of FIG. 4. The collector to emitter voltage $V_{ce}$, the gate to emitter voltage $V_{ge}$ and a current I flowing from the collector to the emitter of the IGBT $Q_1$ are shown at turn-off. It may be observed that there is a major overvoltage (peak) of $V_{ce}$, above the voltage of the source $V_{bus}$, at the time of turn-off.

Solutions exist that tend to limit overvoltage in power electronic switches by slowing down the slope of the gate-emitter voltage. However, excessive limitation of the overvoltage can imply longer switching times of the current, reducing commutation cell performance.

Also, when the power electronic switch 18 turns on, current starts flowing between the collector 22 and the emitter 24. Current flowing through the freewheel diode 16 concurrently diminishes until the entire current $I_{out}$ flows through the power electronic switch 18. An additional current, called a recovery current, circulates in the power electronic switch 18 so that some current circulates in the reverse direction of the freewheel diode 16 until all charges deposited on its junction are removed. The freewheel diode 16 then turns off, allowing voltage to build thereon while voltage between the collector 22 and the emitter 24 of the power electronic switch 18 reduces substantially to zero. When the freewheel diode 16 blocks, the reverse flowing current causes an abrupt voltage increase that in turn causes oscillations between a parasitic capacitance (not explicitly shown) of the freewheel diode 16 and inductances 30 and 34 of the high frequency loop 36.

It is thus interesting to control the di/dt when turning on the power electronic switch 18 since an excessively abrupt drop in voltage could inject current in the gate of an opposite power electronic switch (not shown), causing the opposite power electronic switch to become conductive while the power electronic switch 18 is still conductive. The di/dt also generates important and undesirable electromagnetic interference (EMI).

Therefore, there is a need for circuits capable of reducing overvoltage occurring upon switching in a power converter.

SUMMARY

According to the present disclosure, there is provided a power converter configured for limiting switching overvoltage. The power converter includes a pair of commutation cells. Each commutation cell includes a power electronic switch and a gate driver connected to a gate of the power electronic switch. A reference of the gate driver of a first power electronic switch is connected to a ground of the power converter. A reference of the gate driver of a second power electronic switch is connected to a collector of the power electronic switch of the first commutation cell. The gate driver of the power electronic switch has a single voltage power supply.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which.

Like numerals represent like features on the various drawings.

DETAILED DESCRIPTION

Various aspects of the present disclosure generally address one or more of the problems of overvoltage present power converters at the time of switching.

Circuits operable to limit overvoltage in commutation cells, especially at turn-off of IGBTs, are described in international patent publication no WO 2013/082705 A1, in international patent application no PCT/CA2013/000805, in U.S. provisional applications No. 61/808,254, no 61/898, 502 and no 61/904,038, and in "Reducing switching losses and increasing IGBT drive efficiency with Reflex™ gate driver technology", available at http://www.advbe.com/docs/DeciElec2013-Jean Marc Cyr-TM4.pdf, all of which are authored by Jean-Marc Cyr et al. the disclosure of these being incorporated by reference herein.

The present technology provides control of overvoltage and switching losses at turn-off of a power electronic switch of a commutation cell. Circuits and methods presented herein are generally compatible with other solutions to limit overvoltage at turn-off of power electronic switches.

In a commutation cell, di/dt at turn-off of a power electronic switch generates a voltage across stray inductances of a high frequency loop of the commutation cell. This voltage is applied across the power electronic switch in addition to a bus voltage providing power to the commutation cell. A solution based on the injection of a sample of the overvoltage present across the power electronic switch to a gate driver of the power electronic switch has been proposed. When a pair of power electronic switches are connected in series, a parasitic inductance present being an emitter of a "top" power electronic switch and a collector of a "bottom" power electronic switch may not be sufficient to provide a sufficient sample of the overvoltage present in the top power electronic switch. An improvement comprises using a gate driver having a single, positive voltage power supply for driving the top power electronic switch. A zero voltage being initially applied by the gate driver to the gate of the top power electronic switch while turned on, a voltage swing required to turn it off is reduced.

The techniques disclosed herein will mainly be described in relation to the use of isolated gate bipolar transistors (IGBT). Mentions of IGBTs in the following description are made for illustration purposes and are not meant to limit the present disclosure. The same techniques may equally be applied to commutation cells constructed using metal-oxide-semiconductor field-effect transistors (MOSFET), bipolar transistors and like power electronic switches.

Generally stated, by changing the reference of the gate driver from the emitter (logical pin) of FIG. 4 to the ground bus (for the bottom IGBT $Q_1$) and to the collector of the bottom IGBT (for the top IGBT $Q_2$), it is possible to decrease this overvoltage of $V_{ce}$ during turn-off. Because available parasitic inductances are not similarly distributed about the top and bottom IGBTs, a variant further proposes to modify a voltage applied to the gate of the top IGBT while turned on.

In other words, a technique for connecting reference of the gate driver to a power tab of the IGBT, the power tab being itself connected to a power source, instead of to the logical pin has been developed. A voltage across the emitter inductance is injected in the gate driver to create a negative voltage at the emitter of the IGBT to slow down the negative slope of $V_{ge}$, as will be discussed hereinbelow. The result is a direct action on the gate voltage without any delay and di/dt limitations.

Figure 6:
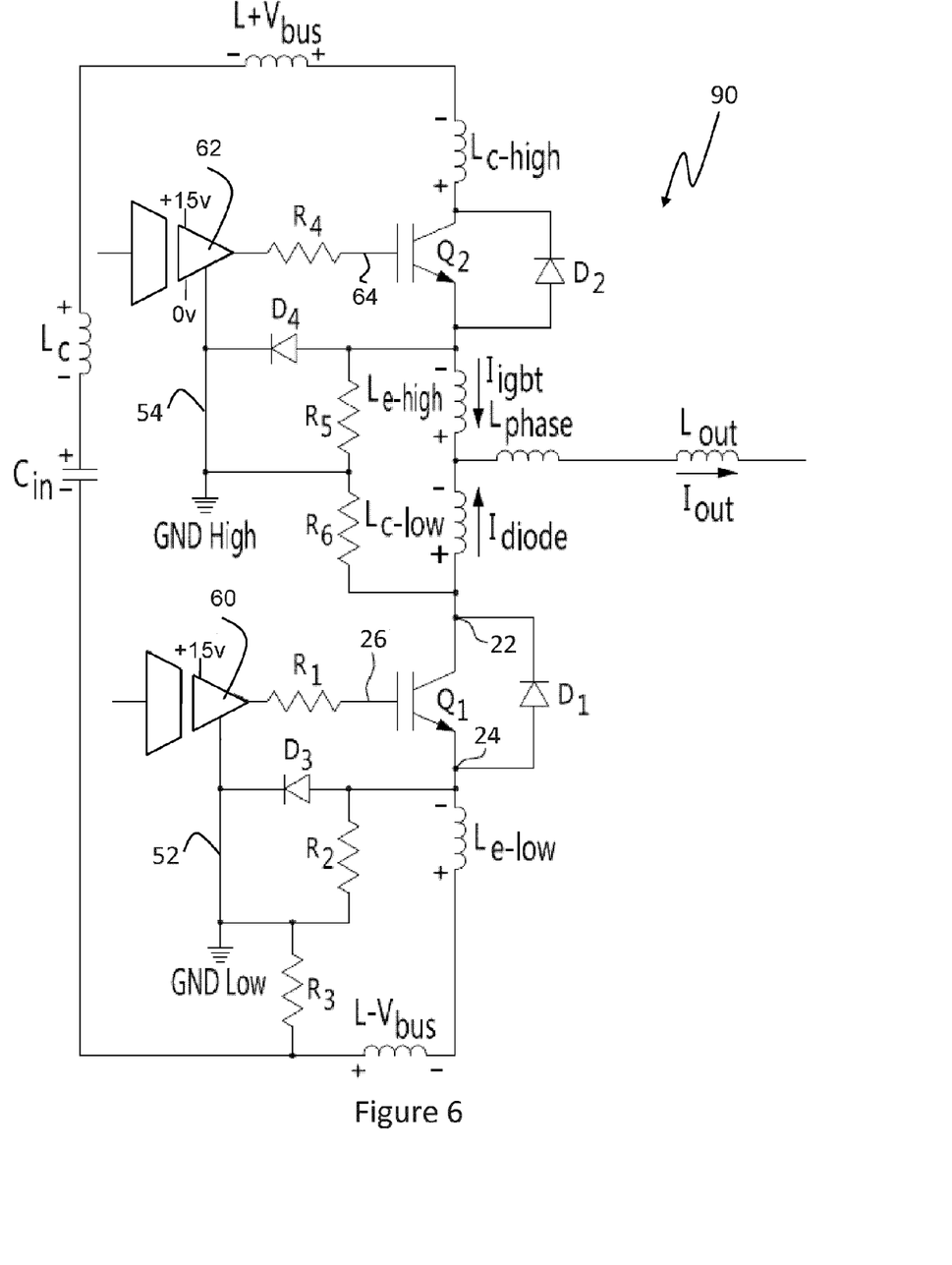
FIG. 6 is a circuit diagram of an IGBT leg having resistive dividers connected across parasitic (stray) emitter inductances, according to an embodiment.

Because there is no optimal emitter inductance between the logical and power connections of the emitter in a commercial IGBT module, the present disclosure introduces a technique developed to optimize the sample of the overvoltage injected in the gate drive circuit using a resistive divider. FIG. 6 is a circuit diagram of an IGBT leg having resistive dividers connected across parasitic (stray) emitter inductances, according to an embodiment. Generally, FIG. 6 shows a power converter having a pair of commutation cells connected in series, each commutation cell including a power electronic switch and a gate driver. The power converter may for example be an IGBT leg 90 including compensation circuits connected to gate drivers 60 and 62 in a configuration that reduces overvoltage on the IGBTs. FIG. 6 introduces a compensation circuit that optimizes overvoltage on the IGBT using a resistive divider.

Discussing the bottom portion of the IGBT leg 90 of FIG. 6, the bottom IGBT $Q_1$ includes a parasitic collector inductance $L_{c-low}$ a parasitic emitter inductance $L_{e-low}$. The gate 26 of the bottom IGBT $Q_1$ connected to its gate driver 60 via a resistor $R_1$. A reference 52 of the gate driver 60 is connected to a compensation circuit having a resistive divider circuit including two resistors $R_2$ and $R_3$ and a diode $D_3$ that allows the turn-on not to be impacted by shorting the resistor $R_2$ when a voltage at the emitter of the bottom IGBT $Q_1$ is higher than the reference 52. The diode $D_3$ is conducting while turning on the IGBT $Q_1$ because the direction of the current in the IGBT $Q_1$ causes a voltage to be higher at the emitter 24 than at the reference 52. In contrast, the diode $D_3$ is not conducting while turning off the IGBT $Q_1$ because a drop of voltage at the emitter 22 causes application of a negative voltage across the diode $D_3$. It is to be noted that while the resistors $R_2$ and $R_3$ are shown connected across both parasitic inductances $L_{e-low}$ and $L_{-Vbus}$, they may alternatively be connected solely across parasitic inductance $L_{e-low}$, should this parasitic inductance be sufficient and the connection available.

Figure 7:
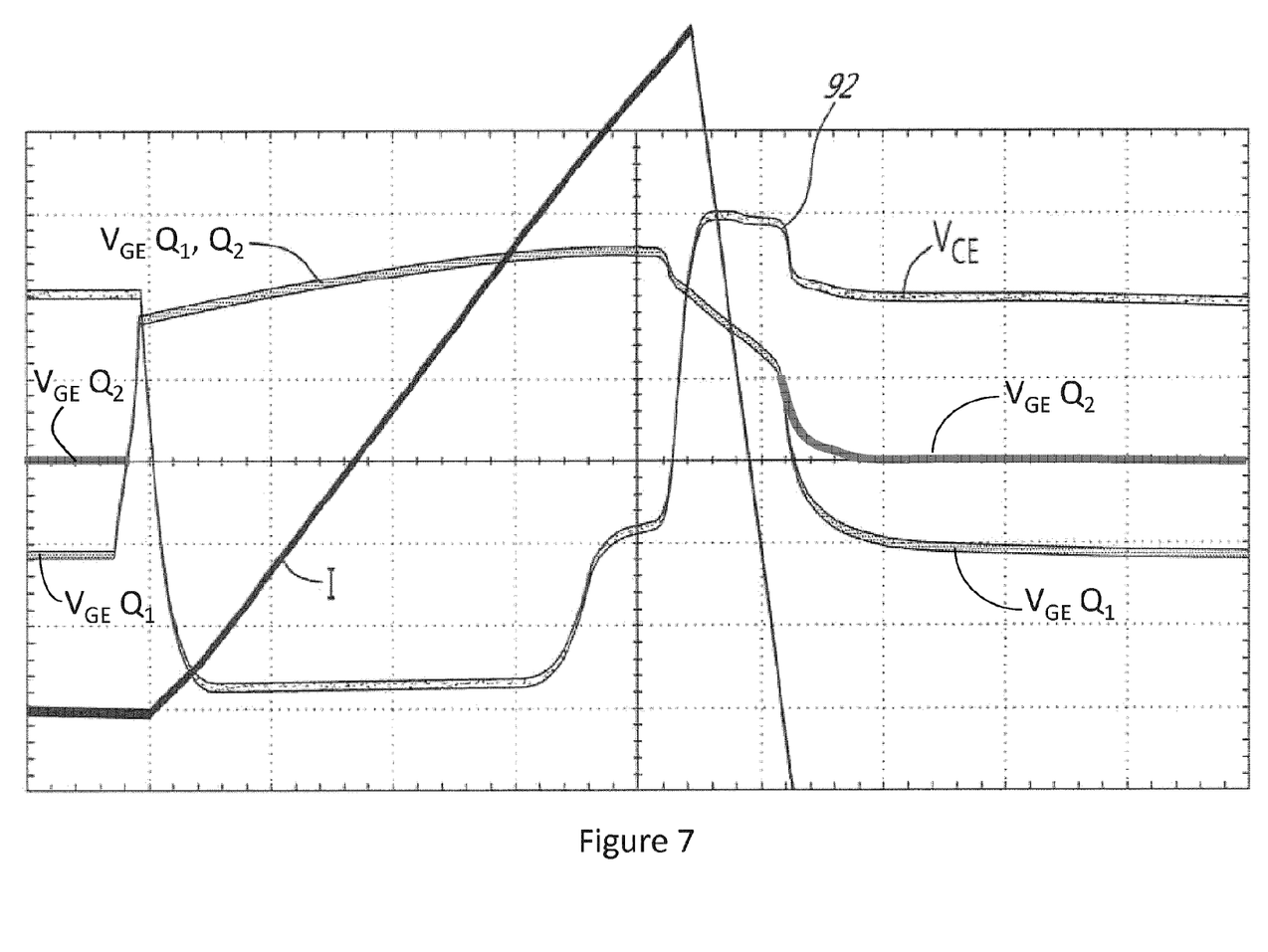
FIG. 7 is a diagram showing current and voltage waveforms at turn-off of the IGBTs of FIG. 6 with a bus voltage of 500 volts.
Figure 8:
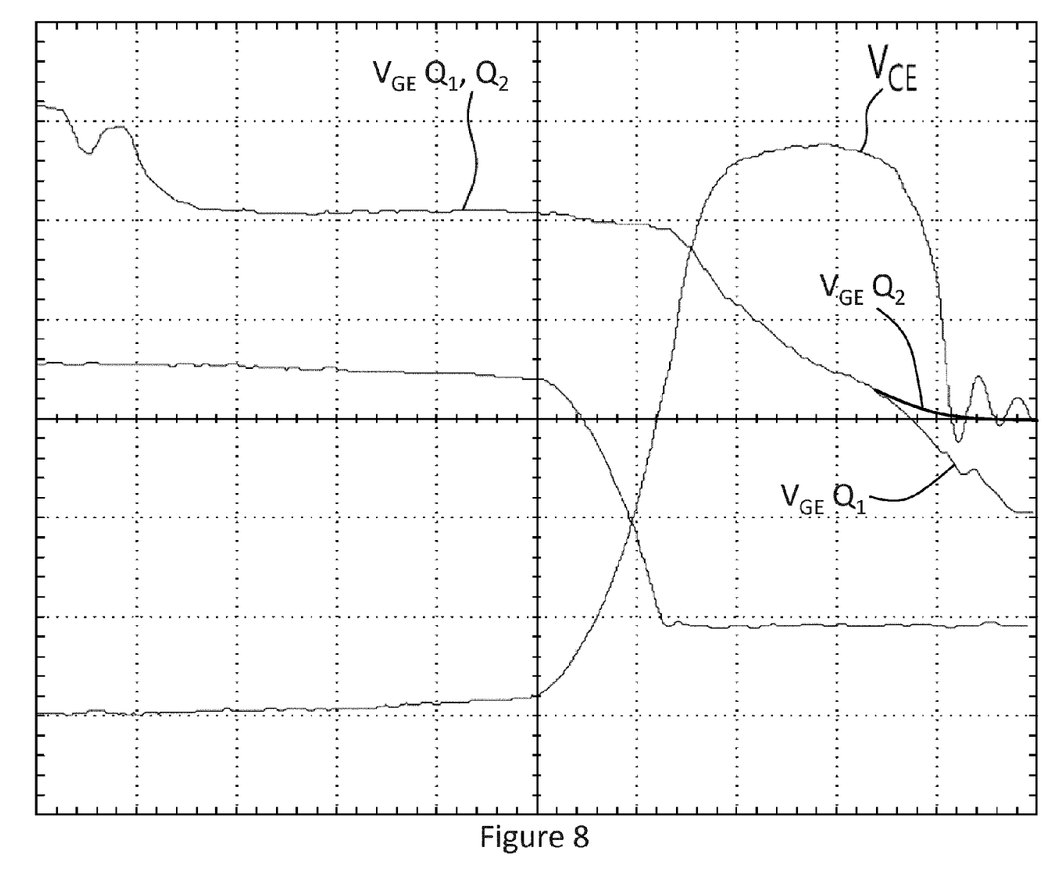
FIG. 8 is a diagram showing current and voltage waveforms at turn-off of the IGBTs of FIG. 6, the resistive divider being adjusted for a maximum bus voltage of 300 volts in short circuit condition.

In the circuit of FIG. 6, values of the resistors $R_2$ and $R_3$ are selected according to an acceptable overvoltage level allowed across the bottom IGBT $Q_1$. FIG. 7 is a diagram showing current and voltage waveforms at turn-off of the IGBTs of FIG. 6 with a bus voltage of about 500 volts. FIG. 8 is a diagram showing current and voltage waveforms at turn-off of the IGBTs of FIG. 6, the resistive divider being adjusted for a maximum bus voltage of 300 volts in short circuit condition. A ratio of $R_2$ over $R_3$ is increased to reduce the overvoltage. The value of these two resistors $R_2$ and $R_3$ in parallel is set, in series with a gate driver resistor $R_1$. A value of the gate driver resistor $R_1$ is adjusted in a conventional manner according to a proper commutation behavior.

By correctly setting values of the resistors of the compensation circuits, it is possible to reduce the effect of the emitter inductance to get the maximum overvoltage allowed to therefore improve the efficiency.

In other words, the normal practice consisting in using a resistor $R_1$ in the ground connection of the gate driver to limit the current in the diodes that protect the gate driver of the lower IGBT from a negative voltage when the upper IGBT turns off has been modified by splitting the resistor in two resistors, including $R_1$ in series with $R_2$ and $R_3$ connected in parallel, and by adapting their ratio to limit the effect of the emitter inductance on the di/dt. An equivalent resistor value may remain the same, but the voltage divider gives the desired weight of the emitter inductance to limit the overvoltage at the desired level.

The overvoltage can be optimized as much as possible to reach the maximum IGBT rating while maintaining the speed of the di/dt for efficiency reasons. This is done by reducing a value of $R_2$, the resistor connected to the IGBT emitter, compared to $R_3$, the resistor connected to the power tab. The voltage across the emitter inductance is thus split in two and only the voltage across the logical resistor is applied in the gate drive circuit to limit the gate voltage drop.

FIGS. 7 and 8 both show the current I and the voltages $V_{ge}$ and $V_{ce}$ during turn-off for the circuit of FIG. 6, for different bus voltages. It may be observed that overvoltage of $V_{ce}$ during turn-off is greatly reduced (see plateau 92). This plateau 92 occurs while a drop rate of the voltage $V_{ge}$ is reduced by the insertion of a sample of the voltage across the parasitic inductance $L_{e-low}$.

The duration of the plateau 92 impacts losses of the commutation cell during turn-off of the IGBT. A longer plateau 92 brings higher losses. Because of the desire to limit at the same time the overvoltage and its length, a square wave shape of the overvoltage plateau 92 is suitable. The intrinsic behavior (natural feedback) of the overvoltage gives this shape.

This technique works very well for the bottom IGBT $Q_1$ because the emitter inductance $L_{e-low}$ is sufficiently large to provide good overvoltage sampling. In contrast, for the top IGBT $Q_2$, the emitter inductance $L_{e-high}$ often has a too small value to suitably clamp a voltage thereacross without increasing the gate resistor $R_4$, to protect the top IGBT $Q_2$. In practice, the emitter inductance $L_{e-high}$ of the top IGBT $Q_2$ is very often too low to be used to bring down the overvoltage across the top IGBT $Q_2$ to a safe level.

Indeed, because of the constraints on packaging of IGBT modules, the upper and lower semiconductors are generally packaged within close proximity of each other so the emitter inductance of the upper IGBT $Q_2$, $L_{e-high}$, is quite small, in the order of a few nH. On the other hand, because the only point of connection other than the logical emitter of the lower IGBT $Q_1$ is the power tab of $-V_{bus}$, the inductance of the lower IGBT $Q_1$, $L_{e-low}$, may be as much as 5 times greater than the upper emitter inductance $L_{e-high}$. The connection of the $-V_{bus}$ tab is highly inductive because of its length and curves.

The comparatively small value of the upper emitter inductance $L_{e-high}$ may impact the effectiveness of the solution described hereinabove when applied without additional modification to the top IGBT $Q_2$.

Figure 9:
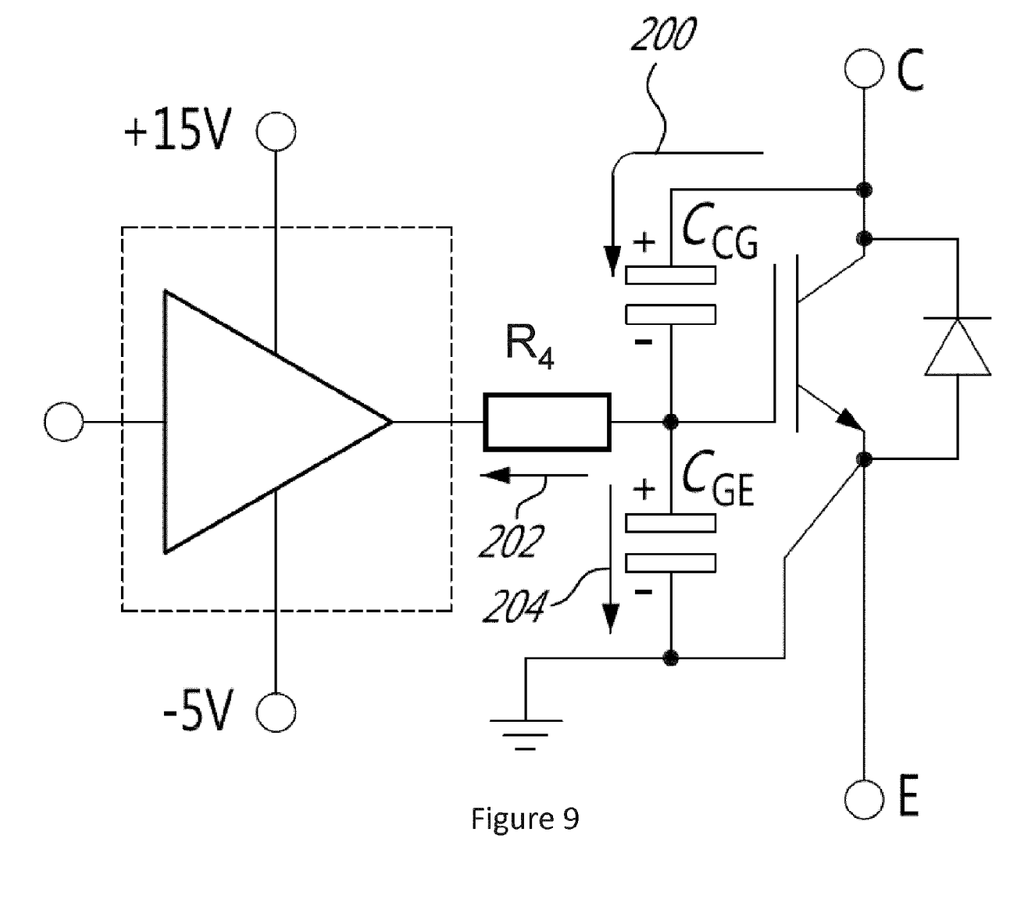
FIG. 9 is a schematic representation of IGBT capacitances including a Miller capacitance.

FIG. 9 is a schematic representation of IGBT capacitances including a Miller capacitance. A Miller current 200 circulates in the Miller capacitance $C_{CG}$, causing a voltage variation dv/dt thereacross. The Miller current 200 is split between a portion 202 flowing through the gate resistor $R_4$ and a portion 204 flowing through a gate to emitter parasitic capacitance $C_{GE}$. The gate driver tries to maintain the gate to emitter voltage $V_{ge}$ in an off state, sinking the current 202 with the gate resistor $R_4$. To this end, the gate resistor $R_4$ has a low value to keep the gate to emitter voltage $V_{ge}$ below the threshold voltage $V_{ge(th)}$ even in the presence of the Miller current.

Retuning to FIG. 4, a typical IGBT leg is shown in which both gate drivers 40 have positive and negative supply voltages connected to +15V and −5V power sources. Voltages induced across each of the emitter parasitic inductances $L_{e-high}$ and $L_{e-low}$ are driven by the sum of their gate to emitter voltages $V_{ge}$, when the IGBTs operate in their linear region, and the negative supply voltage, that is −5V in the typical case of FIG. 4. FIG. 5 shows a gate to emitter voltage $V_{ge}$ of about +7V (in the linear region). Consequently, the total voltages induced across the emitter parasitic inductances $L_{e-high}$ and $L_{e-low}$ reach an average of +12V. In contrast, FIG. 7 shows distinct gate to emitter voltages $V_{ge}$ for both IGBTs, still reaching about +7V (in the linear region), falling to about 0V for the upper IGBT $Q_2$ and to about −5V for the lower IGBT $Q_1$. Consequently, the total voltage induced across the emitter parasitic inductance $L_{e-high}$ reaches an average of +7V while the total voltage induced across the emitter parasitic inductance $L_{e-low}$ reaches an average of +12V.

As previously discussed, the emitter inductance $L_{e-high}$ of the top IGBT $Q_2$ has a smaller value compared to the emitter inductance $L_{e-low}$ of the bottom IGBT $Q_1$. In the embodiment of FIG. 6, a gate driver 62 connected to a gate 64 of the top IGBT $Q_2$ is a single supply gate driver: instead of using a conventional dual supply gate driver having a negative supply voltage of −5V and positive supply voltage of +15V (as in the case of FIG. 4), the gate driver 62 is powered by a single positive supply voltage of +15V, its negative supply voltage being set at 0V, for example being connected to a ground reference 54. By modifying the negative supply of the gate driver 62, the voltage induced in the emitter inductance $L_{e-high}$ at turn-off of the top IGBT $Q_2$ can be maintained as low as +7V, since it is not summed with a −5V of a conventional gate driver, and still successfully maintain the gate to emitter voltage $V_{ge}$ of the top IGBT $Q_2$ in the linear region. As a result, when the negative power supply of the gate driver 62 is at 0V instead of −5V, the sample of the overvoltage can be as low as 7V compared with 12V. For the same overvoltage (for the same di/dt), the parasitic emitter inductance $L_{e-high}$ of the top IGBT $Q_2$ may be only about 60% (i.e. 7/12) of the parasitic emitter inductance that would be required with −5V applied to the negative power supply of the gate driver 62. In summary, the smaller parasitic inductance $L_{e-high}$ of the top IGBT $Q_2$ is sufficient to suitably clamp the voltage across the top IGBT $Q_2$ when using the configuration of FIG. 6.

The gate driver 60 of the bottom IGBT $Q_1$ may be a dual supply gate driver powered using a negative supply voltage of −5V and a positive supply voltage of +15V and still adequately use the $L_{e-low}$. However, the gate driver 60 may optionally use a single power supply, this latter solution being at once effective and more economical.

Generally stated, in the case of conventional power converters, the negative supply voltage of the gate driver of the top IGBT $Q_2$ was required because of the Miller current 200 generated by the collector to emitter voltage variation (dVce/dt) caused by turning on of the bottom IGBT $Q_1$. With the present technology, the negative power supply is not required because the emitter voltage of the top IGBT $Q_2$ is pushed up by the voltage induced across the emitter inductance $L_{e-high}$, which behaves as a negative supply would. The polarity across the emitter inductance $L_{e-high}$ is reversed compared to the indication on FIG. 6 because the current variation (di/dt) is on the opposite direction.

The foregoing describes solutions applicable to DC-DC power converters, AC-DC power converters and to DC-AC power converters, for example commutation cells using a full leg of semiconductors, opposite pairs of power electronic switches and freewheel diodes, to provide alternative current to a connected load such as a motor of an electric vehicle.

Those of ordinary skill in the art will realize that the description of the power converter are illustrative only and are not intended to be in any way limiting. Other embodiments will readily suggest themselves to such persons with ordinary skill in the art having the benefit of the present disclosure. Furthermore, the power converter may be customized to offer valuable solutions to existing needs and problems of overvoltage occurring upon switching in power converters.

In the interest of clarity, not all of the routine features of the implementations of the power converter are shown and described. It will, of course, be appreciated that in the development of any such actual implementation of the power converter, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the power converter is not limited in its application to the details of construction and parts illustrated in the accompanying drawings and described hereinabove. The proposed commutation cell and compensation circuit for limiting switching overvoltage and for limiting recovery current is capable of other embodiments and of being practiced in various ways. It is also to be understood that the phraseology or terminology used herein is for the purpose of description and not limitation. Hence, although the commutation cell and compensation circuit for limiting switching overvoltage and for limiting recovery current has been described hereinabove by way of illustrative embodiments thereof, it can be modified, without departing from the spirit, scope and nature of the subject invention.

What is claimed is:

1. A power converter configured for limiting switching overvoltage, comprising:
   a pair of first and second commutation cells, each commutation cell including a power electronic switch, a gate driver connected to a gate of the power electronic switch, and respective first and second resistors connected in series and connected across a parasitic emitter inductance of the power electronic switch,
   a reference of the gate driver of a first commutation cell being connected to a ground of the power converter, the reference of the gate driver of the first commutation cell being also connected to a connection point between the first and second resistors of the first commutation cell,
   a reference of the gate driver of a second commutation cell being connected to a collector of the power electronic switch of the first commutation cell, the reference of the gate driver of the second commutation cell being also connected to a connection point between the first and second resistors of the second commutation cell,
   wherein the gate driver of the second commutation cell has solely a single positive voltage power supply input.

2. The power converter of claim 1, wherein the negative voltage supply input of the gate driver of the first commutation cell is connected to the ground of the power converter.

3. The power converter of claim 1, wherein the power electronic switches include isolated gate bipolar transistors (IGBT).

4. The power converter of claim 1, wherein the power converter is a DC to AC power converter.

5. The power converter of claim 1, wherein the power electronic switches each include a collector and an emitter.

6. The power converter of claim 1, wherein each commutation cell includes first and second resistors connected in series and connected across a parasitic emitter inductance of the power electronic switch, the reference of the gate driver being connected to a connection point between the first and second resistors.

7. The power converter of claim 6, wherein each commutation cell includes a diode connected in parallel to one of the first and second resistors, between an emitter of the power electronic switch and the reference of the gate driver, the diode becoming conductive when a voltage at the emitter of the power electronic switch is greater than a voltage of the reference of the gate driver.

8. The power converter of claim 1, wherein:
- a high frequency loop is defined by the pair of commutation cells;
- parasitic inductances are defined by interconnection of elements of the high frequency loop; and
- voltages induced in the parasitic inductances of the high frequency loop are sampled and supplied to the references of the gate drivers to slow down a variation of gate-emitter voltages of the power electronic switches.

* * * * *